(12) United States Patent
Tsai et al.

(10) Patent No.: US 12,575,048 B2
(45) Date of Patent: Mar. 10, 2026

(54) ELECTRONIC ASSEMBLY, CASING ASSEMBLY AND ELECTRONIC APPARATUS

(71) Applicant: WISTRON CORP., New Taipei City (TW)

(72) Inventors: Mengping Tsai, New Taipei City (TW); Shihlun Chiu, New Taipei City (TW); Peiyu Lee, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 154 days.

(21) Appl. No.: 18/761,669

(22) Filed: Jul. 2, 2024

(65) Prior Publication Data

US 2025/0351284 A1     Nov. 13, 2025

(30) Foreign Application Priority Data

May 8, 2024     (TW) ................................. 113116991

(51) Int. Cl.
H05K 5/10         (2025.01)
H05K 5/02         (2006.01)
H05K 7/20         (2006.01)

(52) U.S. Cl.
CPC ............. H05K 5/10 (2025.01); H05K 5/0209 (2022.08); H05K 7/20254 (2013.01)

(58) Field of Classification Search
CPC .... H05K 5/10; H05K 5/0209; H05K 7/20254; H05K 7/20781; H05K 7/20645
See application file for complete search history.

(56) References Cited

U.S. PATENT DOCUMENTS 3,387,648 A * 6/1968 Ward, Jr. ........... H05K 7/20572
                                                         165/104.34
4,519,013 A * 5/1985 Breeze .................... H02B 1/56
                                                         211/26

(Continued)

FOREIGN PATENT DOCUMENTS

CN          218977086 U      5/2023

OTHER PUBLICATIONS

TW Office Action dated Jul. 2, 2025 in Taiwan application No. 113116991.

*Primary Examiner* — Anthony M Haughton
*Assistant Examiner* — Theron S Milliser
(74) *Attorney, Agent, or Firm* — McClure, Qualey & Rodack, LLP

(57)          ABSTRACT

An electronic apparatus includes a casing assembly and an electronic assembly. The casing assembly includes a casing and a heat dissipation unit. The heat dissipation unit is disposed in the casing and includes a heat dissipation main body. The heat dissipation main body is provided with a first inclined surface. The electronic assembly is slidably mounted in the casing and includes an electronic unit and a thermal interface material. The electronic unit includes an electronic main body, the electronic main body is provided with a second inclined surface. The thermal interface material is disposed on the second inclined surface of the electronic unit, and the thermal interface material is in contact with the first inclined surface of the heat dissipation unit so as to thermally couple the electronic assembly with the heat dissipation unit.

20 Claims, 7 Drawing Sheets

(56) References Cited

U.S. PATENT DOCUMENTS

| 5,150,277 | A | * | 9/1992 | Bainbridge | H05K 7/206 |
| | | | | | 361/695 |
| 5,361,188 | A | * | 11/1994 | Kondou | H01L 23/467 |
| | | | | | 165/104.34 |
| 5,428,503 | A | * | 6/1995 | Matsushima | H05K 7/20154 |
| | | | | | 361/695 |
| 6,765,796 | B2 | * | 7/2004 | Hoffman | H05K 7/20563 |
| | | | | | 361/689 |
| 7,085,133 | B2 | * | 8/2006 | Hall | H05K 7/20572 |
| | | | | | 361/695 |
| 8,456,840 | B1 | * | 6/2013 | Clidaras | H05K 7/20745 |
| | | | | | 361/679.48 |
| 8,638,553 | B1 | * | 1/2014 | Czamara | G06F 1/20 |
| | | | | | 361/679.48 |
| 2004/0100773 | A1 | * | 5/2004 | Hoffman | H05K 7/20563 |
| | | | | | 257/719 |
| 2005/0022967 | A1 | * | 2/2005 | Hall | H05K 7/20572 |
| | | | | | 165/80.2 |
| 2014/0078668 | A1 | * | 3/2014 | Goulden | G06F 1/20 |
| | | | | | 454/239 |
| 2025/0351284 | A1 | * | 11/2025 | Tsai | H05K 5/10 |

* cited by examiner

ELECTRONIC ASSEMBLY, CASING ASSEMBLY AND ELECTRONIC APPARATUS

CROSS-REFERENCE TO RELATED APPLICATIONS

This non-provisional application claims priority under 35 U.S.C. § 119(a) on Patent Application No(s). 113116991 filed in Taiwan, R.O.C. on May 8, 2024, the entire contents of which are hereby incorporated by reference.

TECHNICAL FIELD

The disclosure relates to an electronic assembly, a casing assembly and an electronic apparatus.

BACKGROUND

As science and technology progressing, electronic devices have been developed. Such electronic device is provided with an electronic unit and a heat dissipation unit therein. The heat dissipation unit is fixed in a casing of the electronic device, and the electronic unit is slidably inserted into the casing. Before the electronic unit is inserted into the casing, a thermal paste is applied on the electronic unit in order to thermally couple the electronic unit with the heat dissipation unit via the thermal paste after the electronic unit is inserted into the case.

However, during the process of inserting the electronic unit into the casing, the thermal paste on the electronic unit is easily to be scraped off or damaged by the heat dissipation unit fixed in the casing, causing heat transfer between the electronic unit and the heat dissipation unit does not meet the requirement. Therefore, how to address the aforementioned issue is one of the topics in the field.

SUMMARY

The disclosure provides an electronic assembly, a casing assembly and an electronic apparatus which ensure the heat transfer between the electronic unit and the heat dissipation unit.

One embodiment of the disclosure provides an electronic apparatus. The electronic apparatus includes a casing assembly and at least one electronic assembly. The casing assembly includes a casing and a heat dissipation unit. The heat dissipation unit is disposed in the casing and includes a heat dissipation main body. The heat dissipation main body is provided with at least one first inclined surface, and the first inclined surface is inclined relative to the heat dissipation main body. The electronic assembly is slidably mounted in the casing and includes an electronic unit and a thermal interface material. The electronic unit includes an electronic main body, the electronic main body is provided with a second inclined surface, and the second inclined surface is inclined relative to the electronic main body. The thermal interface material is disposed on the second inclined surface of the electronic unit, and the thermal interface material is in contact with the first inclined surface of the heat dissipation unit so as to thermally couple the electronic assembly with the heat dissipation unit.

Another embodiment of the disclosure provides an electronic assembly. The electronic assembly is adapted to be slidably mounted in a casing and thermally coupled to a heat dissipation unit in the casing. The electronic assembly includes an electronic unit and at least one thermal interface material. The electronic unit includes an electronic main body, the electronic main body is provided with an inclined surface, and the inclined surface is inclined relative to the electronic main body. The thermal interface material is disposed on the inclined surface, and the thermal interface material is adapted to be filled in a gap between the electronic assembly and the heat dissipation unit.

Still another embodiment of the disclosure provides a casing assembly. The casing assembly includes a casing and a heat dissipation unit. The casing includes a plurality of side plates, the side plates surround an accommodation space, sides of the side plates surround an installation opening, and the installation opening communicates with the accommodation space. The heat dissipation unit is disposed in the accommodation space and includes a heat dissipation main body, the heat dissipation main body is provided with an inclined surface, and the inclined surface is inclined relative to the heat dissipation main body from the installation opening along a direction away from the installation opening.

According to the electronic assembly, the casing assembly and the electronic apparatus as discussed in the above embodiments, the heat dissipation main body is provided with the first inclined surface, the electronic main body is provided with the second inclined surface, and the thermal interface material is disposed on the second inclined surface of the electronic unit, such that during the installation of the electronic unit into the casing, the thermal interface material is moved by the first inclined surface of the heat dissipation unit so as to thermally couple the electronic unit with the heat dissipation unit via the thermal interface material, thereby achieving the desired heat transfer efficiency.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
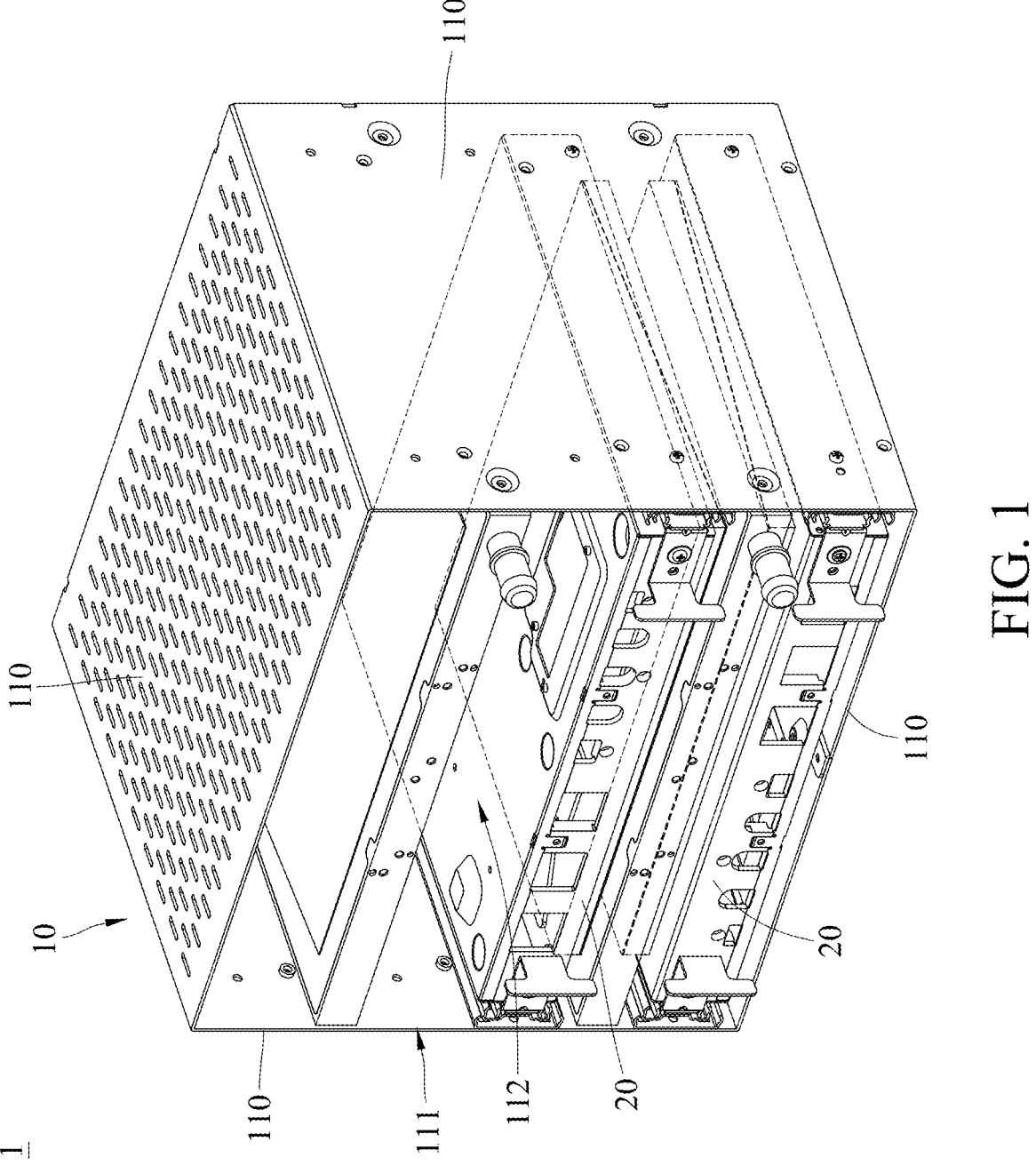
FIG. 1 is a perspective view of an electronic apparatus according to a one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Referring to FIG. 1, FIG. 1 is a perspective view of an electronic apparatus according to a one embodiment of the disclosure. In this embodiment, the electronic apparatus 1 is, for example, a High Performance Computing apparatus. The electronic apparatus 1 includes a casing assembly 10 and a plurality of electronic assemblies 20.

Figure 2:
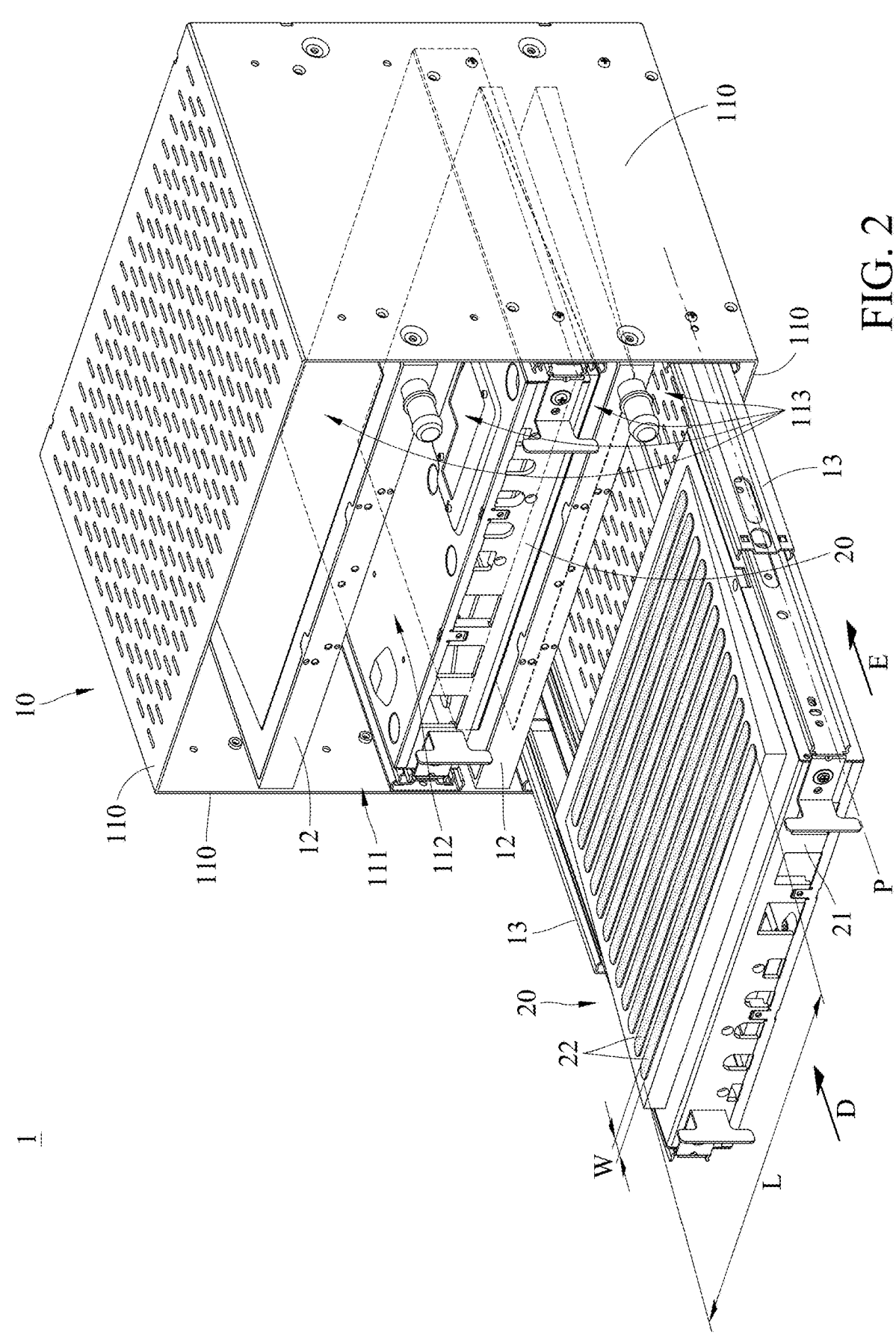
FIG. 2 is a perspective view of the electronic apparatus in FIG. 1 when one of electronic assemblies is located outside a casing.
Figure 3:
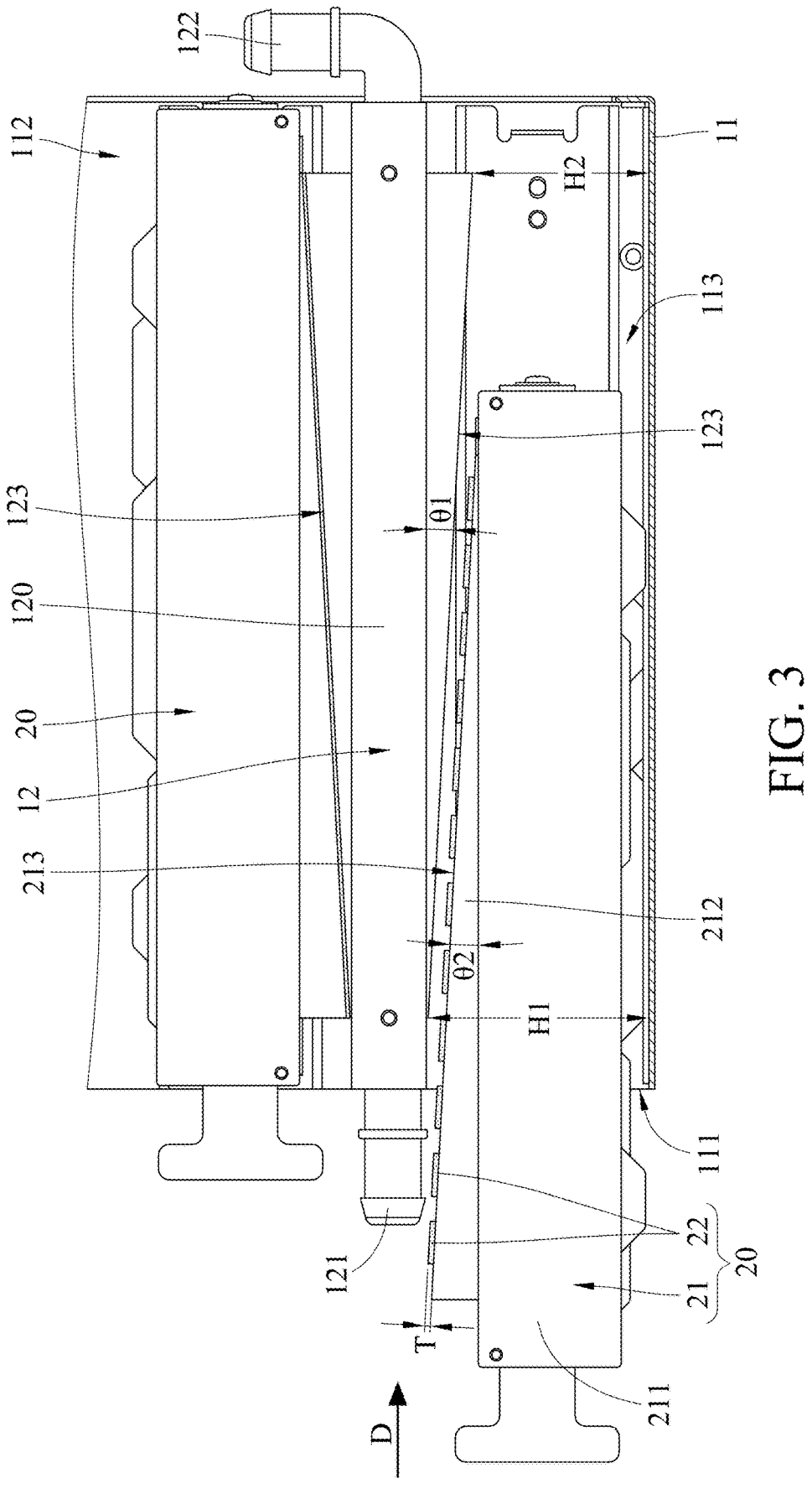
FIG. 3 is a cross-sectional view of the electronic apparatus in FIG. 2 when the electronic assembly is partially pushed into the casing.

Then, referring to FIGS. 1 to 3, FIG. 2 is a perspective view of the electronic apparatus in FIG. 1 when one of electronic assemblies is located outside a casing, and FIG. 3 is a cross-sectional view of the electronic apparatus in FIG. 2 when the electronic assembly is partially pushed into the casing.

The casing assembly 10 includes a casing 11 and a plurality of heat dissipation units 12. The casing 11 includes a plurality of side plates 110, an installation opening 111 and an accommodation space 112. The side plates 110 surround the accommodation space 112, and the installation opening 111 is surrounded by sides of the side plates 110. The installation opening 111 communicates with the accommodation space 112. The heat dissipation units 12 are the same in structure, and thus the following descriptions merely introduce one of them. The heat dissipation unit 12 is, for example, a liquid cooling plate and includes a heat dissipation main body 120, and the heat dissipation main body 120 is provided with an inlet joint 121 and an outlet joint 122 for enabling coolant to flow through the heat dissipation unit 12. In addition, the heat dissipation main body 120 is provided with two first inclined surfaces 123. The two first inclined surfaces 123 are respectively located at two opposite sides of the heat dissipation main body 120 of the heat dissipation unit 12, and the first inclined surfaces 123 are inclined relative to the heat dissipation main body 120 with an angle $\theta1$ of inclination from the installation opening along a direction away from the installation opening 111, and the angle $\theta1$ of inclination of the first inclined surface 123 relative to the heat dissipation main body 120 is, for example, smaller than 5 degrees, such as 3 degrees. The heat dissipation units 12 are fixed in the accommodation space 112 of the casing 11 and are spaced apart from one another, such that a plurality of installation slots 113 are formed in the accommodation space 112. The installation slots 113 are respectively located at sides of the first inclined surfaces 123 of the heat dissipation units 12. In each of the installation slots 113, a height H1 of one side of the installation slot 113 located close to the installation opening 111 is greater than a height H2 of another side of the installation slot 113 located farther away from the installation opening 111.

The electronic assemblies 20 are slidably mounted in installation slots 113 in the casing 11, respectively. The electronic assemblies 20 are similar in structure, and thus the following descriptions merely introduce one of them. The electronic assembly 20 includes an electronic unit 21 and a plurality of thermal interface materials 22. The electronic unit 21 is slidably mount in the installation slot 113 of the casing 11. For example, the casing assembly 10 may further include a plurality of guide rails 13. Two opposite sides of the electronic unit 21 are connected to the casing via two of the guide rails 13, such that the electronic unit 21 is slidably mounted in the installation slot 113 of the casing 11. The slidable direction D of the electronic unit 21 relative to the casing 11 is parallel to extension directions E of the guide rails 13 or long axes P of the guide rails 13.

Note that the electronic unit 21 is not restricted to being slidably mounted in the installation slot 113 of the casing 11 via the guide rails 13. In some other embodiments, the casing assembly may include a plurality of L-shaped brackets, these L-shaped brackets are disposed in the casing and located at two opposite sides of the casing, and the electronic unit may be guided by two opposite L-shaped brackets and slidably mounted in the installation slot of the casing. In another embodiment, the electronic unit may be slidably mounted in the installation slot of the casing without guidance of any component.

The electronic unit 21 includes an electronic main body 211, a protrusion structure 212 and a second inclined surface 213. The protrusion structure 212 protrudes outwardly from the electronic main body 211, and the second inclined surface 213 is located at the protrusion structure 212. The second inclined surface 213 is inclined relative to the electronic main body 211. In other words, the second inclined surface 213 is non-parallel to the slidable direction D of the electronic unit 21 relative to the casing 11; that is, the second inclined surface 213 is at an angle to the slidable direction D of the electronic unit 21, where such angle is, for example, an acute angle. The angle $\theta2$ of inclination of the second inclined surface 213 is, for example, smaller than 5 degrees, such as 3 degrees.

The thermal interface materials 22 are, for example but not limited to, thermal paste. The thermal interface materials 22 are disposed on the second inclined surface 213 of the electronic unit 21 via, for example, a machine (e.g., an auto dotting machine) for saving time and controlling the amount of thermal paste. Before the electronic assembly 20 is placed into the installation slot 113 of the casing 11, the thermal interface materials 22 are, for example, in a strip shape. The thermal interface materials 22 are disposed on the second inclined surface 213 of the electronic unit 21 and spaced apart from each other. Each of the thermal interface materials 22 has a length L about 270 mm and a width W about 12 mm, and a thickness T of each of the thermal interface material 22 is greater than a distance G (e.g., shown in FIG. 7) between the first inclined surface 123 of the heat dissipation unit 12 and the second inclined surface 213 of the electronic unit 21 after being placed into the casing 11. The distance G can also be referred as a width of the gap between the first inclined surface 123 of the heat dissipation unit 12 and the second inclined surface 213 of the electronic unit 21 after being placed into the casing 11. For example, the thicknesses T of the thermal interface materials 22 are 0.5 mm, and the distance G is 0.3 mm.

Figure 4:
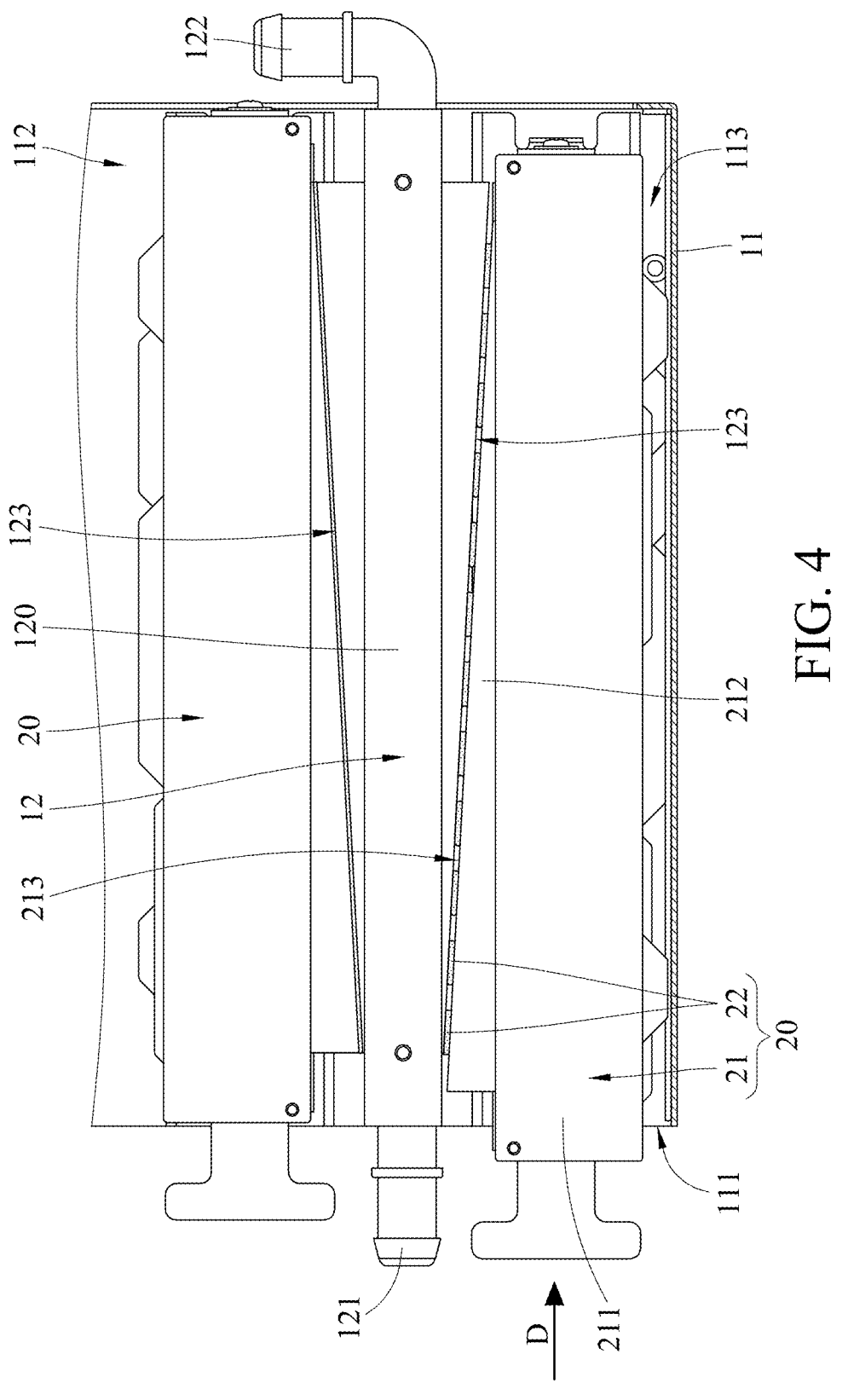
FIG. 4 is a cross-sectional view of the electronic apparatus in FIG. 2 when thermal interface materials of the electronic assembly contact the heat dissipation unit.
Figure 5:
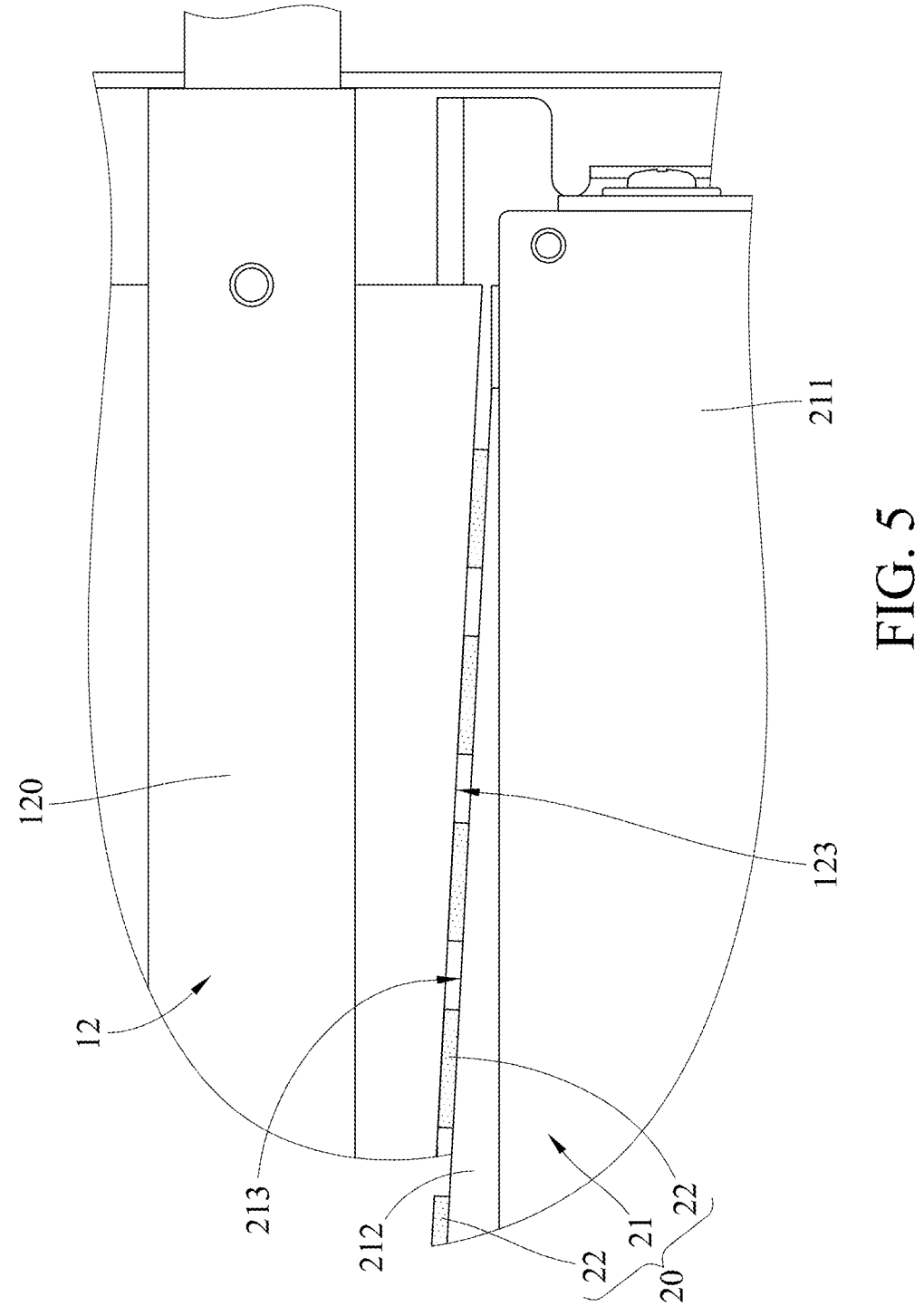
FIG. 5 is a partially enlarged cross-sectional view of the electronic apparatus in FIG. 4.

Then, the following paragraphs will introduce the installation of the electronic assembly 20 into the installation slot 113 of the casing 11. Referring to FIGS. 3 to 5, FIG. 4 is a cross-sectional view of the electronic apparatus in FIG. 2 when thermal interface materials of the electronic assembly contact the heat dissipation unit, and FIG. 5 is a partially enlarged cross-sectional view of the electronic apparatus in FIG. 4.

Firstly, as shown in FIG. 3, the electronic assembly 20 is pushed into the installation slot 113 of the casing 11 along the slidable direction D. Then, as shown in FIGS. 4 and 5, when the electronic assembly 20 is about to be entirely pushed into the installation slot 113 of the casing 11, the thermal interface materials 22 on the second inclined surface 213 of the electronic unit 21 contact the first inclined surface 123 of the heat dissipation unit 12.

Figure 6:
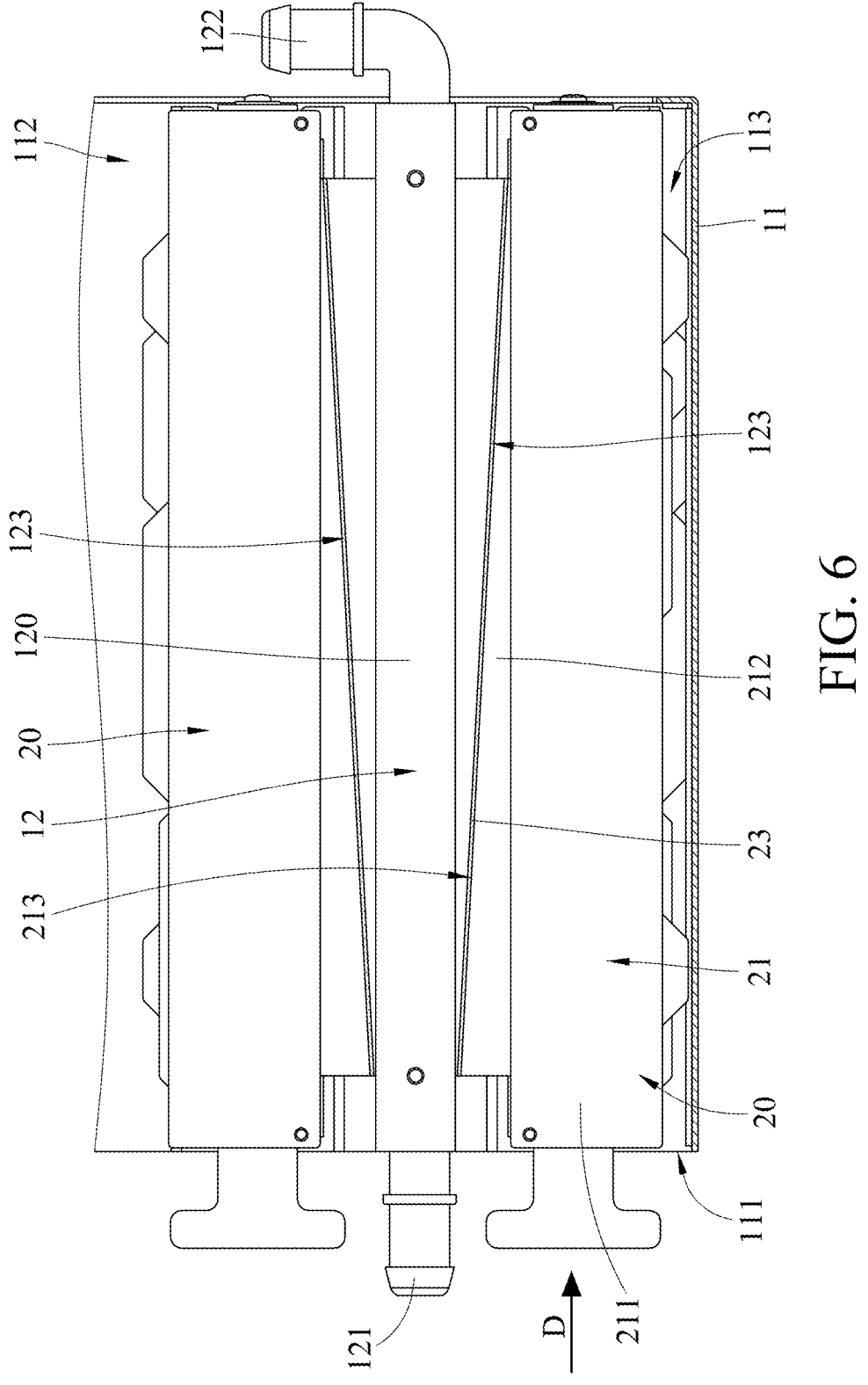
FIG. 6 is a cross-sectional view of the electronic apparatus in FIG. 2 when the electronic assembly is entirely pushed into the casing.
Figure 7:
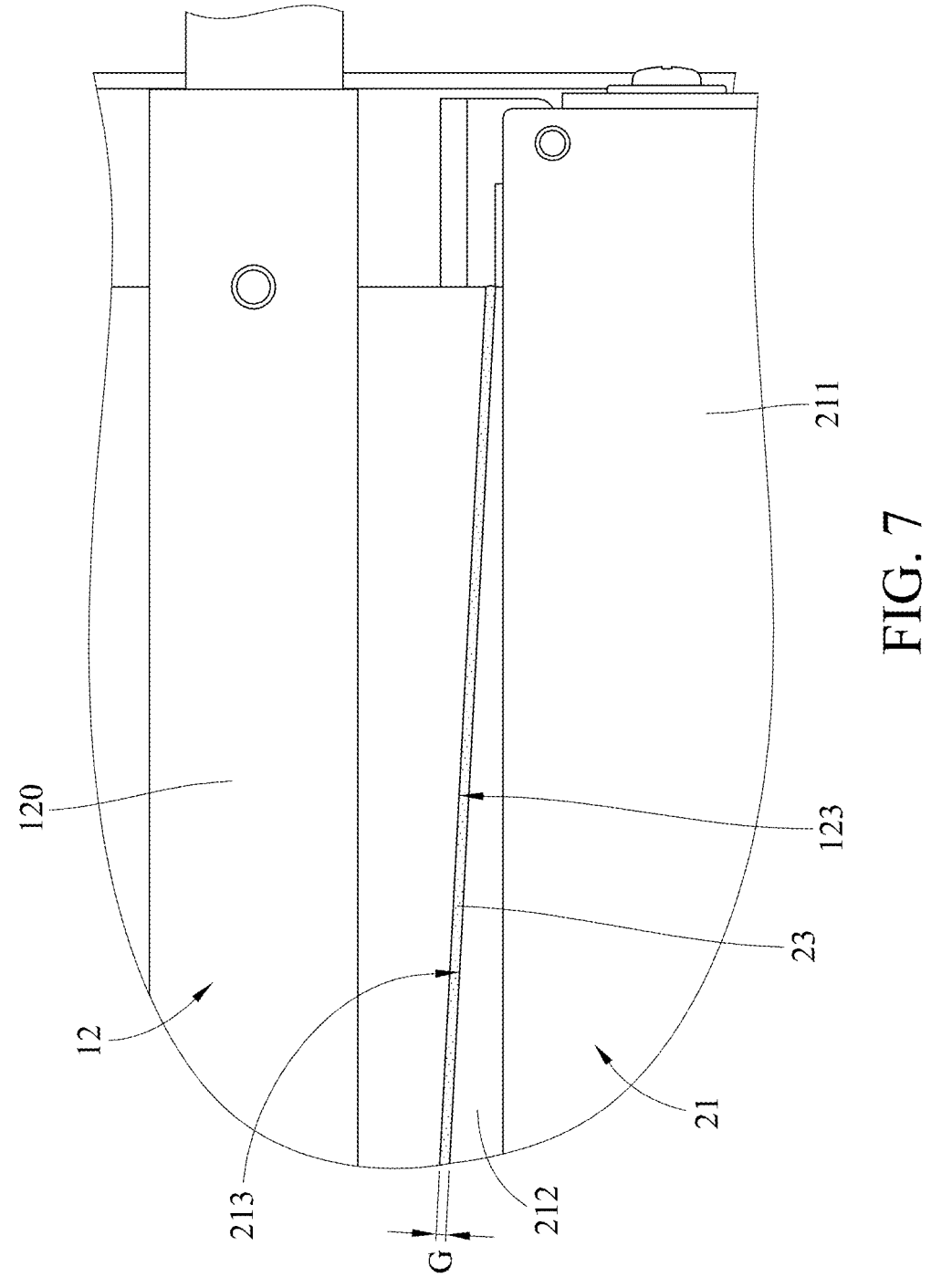
FIG. 7 is a partially enlarged cross-sectional view of the electronic apparatus in FIG. 6.

Then, referring to FIGS. 6 and 7, FIG. 6 is a cross-sectional view of the electronic apparatus in FIG. 2 when the electronic assembly is entirely pushed into the casing, and FIG. 7 is a partially enlarged cross-sectional view of the electronic apparatus in FIG. 6.

As shown in FIGS. 6 and 7, the electronic assembly 20 is further pushed into the installation slot 113 of the casing 11 along the slidable direction D, such that the thermal interface materials 22 on the second inclined surface 213 of the electronic unit 21 are moved by the first inclined surface 123 of the heat dissipation unit 12 so as to fill the gap or the space between the second inclined surface 213 of the electronic unit 21 and the first inclined surface 123 of the heat dissipation unit 12. As a result, after the electronic assembly 20 is entirely pushed into the installation slot 113 of the casing 11, the thermal interface materials 22 form a continuous thermal interface layer 23 between the heat dissipation unit 12 and the electronic unit 21, such that the first inclined surface 123 of the heat dissipation unit 12 and the second inclined surface 213 of the electronic unit 21 are ensured to be thermally coupled to each other via the continuous thermal interface layer 23 with large area, thereby achieving the desired heat transfer efficiency.

In this embodiment, an area of the continuous thermal interface layer 23 formed by the thermal interface materials 22 is, for example, equal to an area of the second inclined surface 213 of the electronic unit 21 or an area of the first inclined surface 123 of the heat dissipation unit 12. Therefore, the first inclined surface 123 of the heat dissipation unit 12 and the second inclined surface 213 of the electronic unit 21 are ensured to be entirely coupled to each other via the continuous thermal interface layer 23, thereby further improving the heat transfer efficiency.

Note that the continuous thermal interface layer 23 is not restricted to being formed by the multiple thermal interface materials 22. In some other embodiments, the continuous thermal interface layer may be formed by a single thermal interface material. In such a case, after the electronic assembly is placed into the installation slot of the casing, an area of the thermal interface material moved by the first inclined surface of the heat dissipation unit may be equal to or smaller than the area of the second inclined surface of the electronic unit or the area of the first inclined surface of the heat dissipation unit.

On the other hand, the thermal interface materials 22 are not restricted to forming the continuous thermal interface layer 23 after being moved by the first inclined surface of the heat dissipation unit. In some other embodiments, the thermal interface materials may be still spaced apart from each other after being moved by the first inclined surface of the heat dissipation unit.

In this embodiment, the angles θ1 and θ2 of inclination of the first inclined surface 123 of the heat dissipation unit 12 and the second inclined surface 213 of the electronic unit 21 are smaller than 5 degrees, which makes the first inclined surface 123 of the heat dissipation unit 12 and the second inclined surface 213 of the electronic unit 21 to be relatively flat for preventing the height of the casing 11 from overly increasing due to the inclined surfaces of the heat dissipation unit 12 and the electronic unit 21, thereby maintain the aesthetic appearance of the electronic apparatus 1.

In addition, the angles θ1 and θ2 of inclination of the first inclined surface 123 of the heat dissipation unit 12 and the second inclined surface 213 of the electronic unit 21 are three degrees, the thicknesses T of the thermal interface materials 22 before the electronic assembly 20 is placed into the installation slot 113 of the casing 11 are 0.5 mm, and the distance G between the first inclined surface 123 of the heat dissipation unit 12 and the second inclined surface 213 of the electronic unit 21 after being placed into the casing 11 is 0.3 mm. Therefore, during the installation of the electronic assembly 20 into the casing 11, the thermal interface materials 22 are not scraped off by the heat dissipation unit 12. After the electronic assembly 20 is entirely pushed into the casing 11, the thermal interface materials 22 are ensured to uniformly spread in the gap between the first inclined surface 123 of the heat dissipation unit 12 and the second inclined surface 213 of the electronic unit 21, thereby achieving the completeness of the structure of the continuous thermal interface layer 23.

Note that the angles θ1 and θ2 of inclination of the first inclined surface 123 of the heat dissipation unit 12 and the second inclined surface 213 of the electronic unit 21, the thicknesses T of the thermal interface materials 22 before the electronic assembly 20 is placed into the installation slot 113 of the casing 11, and the distance G between the first inclined surface 123 of the heat dissipation unit 12 and the second inclined surface 213 of the electronic unit 21 after being placed into the casing 11 are not restricted to being the aforementioned values. As long as the thermal interface materials will not be scraped off by the heat dissipation unit during the installation of the electronic assembly into the casing, and the thermal interface materials can uniformly spread in the gap between the first inclined surface of the heat dissipation unit and the second inclined surface of the electronic unit after the electronic assembly is entirely pushed into the casing, the aforementioned values may be modified as required.

Note that the heat dissipation unit 12 is not restricted to being the liquid cooling plate. In some other embodiments, the heat dissipation unit may be a heat sink with fins. In such case, heat absorbed by the heat dissipation unit may be dissipated via a natural convection manner, or a fan may be provided in the casing for dissipating heat generated by the heat dissipation unit 12 via a forced convection manner.

On the other hand, the quantity of the heat dissipation unit 12 and the quantity of the electronic assembly 20 are not restricted in the disclosure and may be modified to be one in some other embodiment.

According to the electronic assembly, the casing assembly and the electronic apparatus as discussed in the above embodiments, the heat dissipation main body is provided with the first inclined surface, the first inclined surface is inclined relative to the heat dissipation main body along a direction away from the installation opening, the electronic main body is provided with the second inclined surface, the second inclined surface is non-parallel to the slidable direction of the electronic assembly relative to the casing, and the thermal interface materials are disposed on the second inclined surface of the electronic unit, such that during the installation of the electronic unit into the casing, the thermal interface materials are moved by the first inclined surface of the heat dissipation unit so as to form the continuous thermal interface layer between the heat dissipation unit and the electronic unit. Therefore, the first inclined surface of the heat dissipation unit and the second inclined surface of the electronic unit are ensured to be thermally coupled to each other via the continuous thermal interface layer with large area, thereby achieving the desired heat transfer efficiency.

In addition, the area of the continuous thermal interface layer is equal to the area of the second inclined surface of the electronic unit or the area of the first inclined surface of the heat dissipation unit. Therefore, the first inclined surface of the heat dissipation unit and the second inclined surface of the electronic unit are ensured to be entirely coupled to each other via the continuous thermal interface layer, thereby further improving the heat transfer efficiency.

Furthermore, the angles of inclination of the first inclined surface of the heat dissipation unit and the second inclined surface of the electronic unit are smaller than 5 degrees, which makes the first inclined surface of the heat dissipation unit and the second inclined surface of the electronic unit to be relatively flat for preventing the height of the casing from overly increasing due to the inclined surfaces of the heat dissipation unit and the electronic unit, thereby maintain the aesthetic appearance of the electronic apparatus.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic apparatus, comprising:
a casing assembly, comprising:
    a casing; and
    a heat dissipation unit, disposed in the casing and comprising a heat dissipation main body, wherein the heat dissipation main body is provided with at least one first inclined surface, and the at least one first inclined surface is inclined relative to the heat dissipation main body; and
at least one electronic assembly, slidably disposed in the casing and comprising:
    an electronic unit, comprising an electronic main body, wherein the electronic main body is provided with a second inclined surface, and the second inclined surface is inclined relative to the electronic main body; and
    a thermal interface material, disposed on the second inclined surface of the electronic unit, wherein the thermal interface material is in contact with the at least one first inclined surface of the heat dissipation unit so as to thermally couple the at least one electronic assembly with the heat dissipation unit.

2. The electronic apparatus according to claim 1, wherein the casing comprises a plurality of side plates, the plurality of side plates surround an accommodation space, sides of the plurality of side plates surround an installation opening, the installation opening communicates with the accommodation space, the heat dissipation unit is disposed in the accommodation space, and the at least one first inclined surface is inclined relative to the heat dissipation main body from the installation opening along a direction away from the installation opening.

3. The electronic apparatus according to claim 1, wherein the at least one first inclined surface comprises two first inclined surfaces, the two first inclined surfaces are disposed at two opposite sides of the heat dissipation main body, the at least one electronic assembly comprises two electronic assemblies, the two second inclined surfaces of the two electronic assemblies respectively face the two first inclined surfaces of the heat dissipation unit.

4. The electronic apparatus according to claim 1, wherein the electronic unit further comprises a protrusion structure, the protrusion structure protrudes from the electronic main body, and the second inclined surface is located on the protrusion structure.

5. The electronic apparatus according to claim 1, wherein angles of inclination of the at least one first inclined surface and the second inclined surface are smaller than 5 degrees.

6. The electronic apparatus according to claim 5, wherein the angles of inclination of the at least one first inclined surface and the second inclined surface are 3 degrees.

7. The electronic apparatus according to claim 1, wherein a thickness of the thermal interface material is equal to a distance between the second inclined surface of the electronic unit and the at least one first inclined surface of the heat dissipation unit.

8. The electronic apparatus according to claim 7, wherein the distance between the second inclined surface of the electronic unit and the at least one first inclined surface of the heat dissipation unit is 0.3 mm.

9. The electronic apparatus according to claim 1, wherein an area of the thermal interface material is equal to an area of the second inclined surface of the electronic unit or an area of the at least one first inclined surface of the heat dissipation unit.

10. The electronic apparatus according to claim 1, wherein the heat dissipation unit is fixed in the casing.

11. The electronic apparatus according to claim 1, wherein the heat dissipation unit is a liquid cooling plate.

12. The electronic apparatus according to claim 1, wherein the thermal interface material is a thermal paste.

13. An electronic assembly, slidably disposed in a casing and thermally coupled to a heat dissipation unit in the casing, the electronic assembly comprising:
an electronic unit, comprising an electronic main body, wherein the electronic main body is provided with an inclined surface, and the inclined surface is inclined relative to the electronic main body; and
at least one thermal interface material, disposed on the inclined surface, wherein the at least one thermal interface material is used to be filled in a gap between the electronic assembly and the heat dissipation unit.

14. The electronic assembly according to claim 13, wherein the electronic unit further comprises a protrusion structure, the protrusion structure protrudes from the electronic main body, and the inclined surface is located on the protrusion structure.

15. The electronic assembly according to claim 13, wherein an angle of inclination of the inclined surface is smaller than 5 degrees.

16. The electronic assembly according to claim 13, wherein the angle of inclination of the inclined surface is 3 degrees.

17. The electronic assembly according to claim 13, wherein the at least one thermal interface material comprises a plurality of thermal interface materials, the plurality of thermal interface materials are disposed on the inclined surface of the electronic unit and are spaced apart from one another.

18. The electronic assembly according to claim 17, wherein the plurality of thermal interface materials are in a strip shape.

19. The electronic assembly according to claim 13, wherein a thickness of the at least one thermal interface material is greater than a distance between the electronic assembly and the heat dissipation unit.

20. A casing assembly, comprising:
a casing, comprising a plurality of side plates, wherein the plurality of side plates surround an accommodation space, sides of the plurality of side plates surround an installation opening, and the installation opening communicates with the accommodation space; and a heat dissipation unit, disposed in the accommodation space and comprising a heat dissipation main body, wherein the heat dissipation main body is provided with an inclined surface, and the inclined surface is inclined relative to the heat dissipation main body from the installation opening along a direction away from the installation opening.

* * * * *